US009257907B2

(12) United States Patent
Nomiyama et al.

(10) Patent No.: US 9,257,907 B2
(45) Date of Patent: Feb. 9, 2016

(54) SEMICONDUCTOR INTEGRATED CIRCUIT AND METHOD FOR OPERATING THE SAME

(71) Applicant: RENESAS ELECTRONICS CORPORATION, Kanagawa (JP)

(72) Inventors: Takahiro Nomiyama, Kanagawa (JP); Koji Tateno, Kanagawa (JP); Daisuke Kondo, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 277 days.

(21) Appl. No.: 14/064,522

(22) Filed: Oct. 28, 2013

(65) Prior Publication Data

US 2014/0176093 A1    Jun. 26, 2014

(30) Foreign Application Priority Data

Dec. 26, 2012    (JP) .................................. 2012-282341

(51) Int. Cl.
| | |
|---|---|
| H02M 3/158 | (2006.01) |
| H03K 17/12 | (2006.01) |
| H03K 17/16 | (2006.01) |
| H02M 1/00 | (2007.01) |

(52) U.S. Cl.
CPC ............ *H02M 3/158* (2013.01); *H03K 17/122* (2013.01); *H03K 17/164* (2013.01); *H02M 2001/0058* (2013.01); *H03K 2217/0036* (2013.01); *H03K 2217/0063* (2013.01); *H03K 2217/0072* (2013.01); *Y02B 70/1491* (2013.01)

(58) Field of Classification Search
CPC ............................................. H02M 2001/0058
See application file for complete search history.

(56) References Cited

U.S. PATENT DOCUMENTS

| 6,275,399 B1 * | 8/2001 | Miyazaki ............. H03K 17/165 363/132 |
| 6,353,309 B1 * | 3/2002 | Ootani ..................... G05F 1/575 323/282 |
| 6,420,858 B1 | 7/2002 | Kitagawa et al. |
| 6,825,641 B2 * | 11/2004 | Pigott ................. H02M 3/1584 323/222 |
| 7,138,698 B2 * | 11/2006 | Nakamura .............. H02M 1/08 257/206 |
| 8,183,892 B2 * | 5/2012 | Gillberg .......... H01J 21/823487 327/108 |
| 2003/0183924 A1 * | 10/2003 | Bhalla ..................... H01L 24/49 257/723 |

(Continued)

FOREIGN PATENT DOCUMENTS

| JP | 000-197348 A | 7/2000 |
| JP | 2001-016083 A | 1/2001 |
| JP | 2004-040854 A | 2/2004 |

*Primary Examiner* — Timothy J Dole
*Assistant Examiner* — Yusef Ahmed
(74) *Attorney, Agent, or Firm* — Mattingly & Malur, PC

(57) ABSTRACT

A switching loss is reduced by reducing a deviation from the operational principle of zero-volt switching (ZVS). A semiconductor integrated circuit includes high-side switch elements Q11 and Q12, a low-side switch element Q2, and a controller CNT. A decoupling capacitance Cin is coupled between one end of a high-side element and an earth potential, and the high-side element includes the first and second transistors Q11 and Q12 coupled in parallel. In changing the high-side elements from an on-state to an off-state, CNT controls Q12 from an on-state to an off-state by delaying Q12 relative to Q11. Q11 and Q12 are divided into a plurality of parts inside a semiconductor chip Chip 1, a plurality of partial first transistors formed by dividing Q11 and a plurality of partial second transistors formed by dividing Q12 are alternately arranged in an arrangement direction of Q11 and Q12, inside the semiconductor chip Chip 1.

20 Claims, 10 Drawing Sheets

(56) References Cited

U.S. PATENT DOCUMENTS

| | | | |
|---|---|---|---|
| 2005/0052168 A1* | 3/2005 | Tazawa | H02M 3/1584 323/282 |
| 2005/0231177 A1* | 10/2005 | Tateno | H02M 3/1588 323/225 |
| 2007/0114983 A1* | 5/2007 | Weng | H02M 3/1563 323/282 |
| 2007/0145580 A1* | 6/2007 | Satou | H01L 23/49575 257/723 |
| 2007/0159150 A1* | 7/2007 | Hosokawa | H02M 3/1588 323/285 |
| 2007/0200537 A1* | 8/2007 | Akiyama | H01L 24/34 323/234 |
| 2010/0109625 A1* | 5/2010 | Ohtake | H02M 3/1584 323/282 |
| 2011/0031952 A1* | 2/2011 | Nakamura | H01L 21/823425 323/311 |
| 2011/0181255 A1* | 7/2011 | Hashimoto | H02M 3/1588 323/272 |
| 2012/0306469 A1* | 12/2012 | Shono | H02M 1/08 323/311 |
| 2013/0033243 A1* | 2/2013 | Takemae | H02M 3/1588 323/271 |
| 2013/0214754 A1* | 8/2013 | Chiang | G05F 1/565 323/285 |
| 2014/0152284 A1* | 6/2014 | Rozek | H02M 3/156 323/284 |

* cited by examiner

SEMICONDUCTOR INTEGRATED CIRCUIT AND METHOD FOR OPERATING THE SAME

CROSS-REFERENCE TO RELATED APPLICATION

The disclosure of Japanese Patent Application No. 2012-282341 filed on Dec. 26, 2012 including the specification, drawings and abstract is incorporated herein by reference in its entirety.

BACKGROUND

The present invention relates to a semiconductor integrated circuit used for a DC-DC converter of a switching regulator system and a method for operating the same, and in particular relates to a technique effective in reducing a switching loss by reducing a deviation from the operational principle of zero-volt switching (ZVS).

For battery powered electronic devices such as a notebook PC (Personal Computer), a DC-DC converter is used for converting a DC voltage supplied from an AC adapter or a battery into a DC voltage supplied to a load that is a central processing unit of a notebook PC (CPU), namely, a microprocessor.

In recent years, as a countermeasure against global environmental problems, energy saving has been emphasized and an attention has been paid on an increase in efficiency and a reduction in power consumption, in particular a reduction in standby power consumption, of a switching power supply used for various electronic devices.

Conventionally, in a DC-DC converter, a high conversion efficiency is achieved by using a switching regulator performing a PWM (Pulse Width Modulation) control, a PFM (Pulse Frequency Modulation) control, or the like. That is, the DC-DC converter of a switching regulator system controls the on/off of a semiconductor switch by feedback control so as to maintain a DC voltage supplied to a load at a predetermined target value.

The following FIG. 31 of Japanese Patent Laid-Open No. 2000-197348 (Patent Document 1) and the disclosure related thereto describe a voltage-mode-type DC-DC converter including an error amplifier, a comparator, a triangular waveform generation circuit, a driver circuit, a high-side switch element, a low-side switch element, an inductor, and a capacitor.

A reference voltage is supplied to a non-inverting input terminal of the error amplifier, and an output voltage at a connection node between the inductor and the capacitor is supplied to an inverting input terminal of the error amplifier. An output voltage of the error amplifier is supplied to a non-inverting input terminal of the comparator, a triangular waveform signal generated from the triangular waveform generation circuit is supplied to an inverting input terminal of the comparator, and an output signal of the comparator is supplied to the driver circuit. Since the driver circuit complementarily drives the high-side switch element and the low-side switch element, an on-off operation of the high-side switch element is opposite to an on-off operation of the low-side switch element.

The following Japanese Patent Laid-Open No. 2001-016083 (Patent Document 2) describes that in a switching semiconductor device, such as a transistor or a field effect transistor, one such element cannot strike a balance between an increase in switching speed (speed of switching between an on-state and an off-state) and a reduction in on-resistance (saturation voltage) because the switching speed and the on-resistance are generally in a trade-off relationship. The following Patent Document 2 describes that in order to reduce a power loss, a first transistor having a high switching speed and a second transistor having a low on-resistance are coupled in parallel, and thus a conductive state and non-conductive state of a conduction path are switched by using both the first and the second transistors. At the time of switching from a non-conductive state to a conductive state, first, the first transistor having a high switching speed is turned on, and then at the timing when this element is saturated, the second transistor having a low on-resistance is turned on, and at the time of switching from a conductive state to a non-conductive state, the first transistor is turned off after turning-off of the second transistor. Furthermore, FIG. 17 of Patent Document 2 and the disclosure related thereto describe that the first transistor, the second transistor, and a controller are formed in a first region 64a, a second region 64b, and a third region 64c of a semiconductor chip, respectively.

Japanese Patent Laid-Open No. 2004-040854 (Patent Document 3) describes that in a chopper type switching power supply, a first transistor having a small current capacity and a second transistor having a large current capacity are coupled in parallel on a power supply path. Here, the first transistor having a small current capacity is controlled to be in an off-state by delaying the first transistor relative to the second transistor having a large current capacity. Thus, in the course of switching, a source to drain voltage of a MOS transistor is maintained at zero and a power loss in a switch element is suppressed.

SUMMARY

The present inventors have involved in development of a DC-DC converter of a low-loss switching regulator system prior to the present invention. In particular, in this development, in a DC-DC converter of a switching regulator system including a high-side switch element, a low-side switch element, a smoothing inductor, a smoothing capacitor, a decoupling inductor, and a decoupling capacitor, a reduction in switching loss of the high-side switch element is required.

FIG. 6 is a view showing a configuration of the DC-DC converter of a switching regulator system examined by the present inventors prior to the present invention.

As shown in FIG. 6, the DC-DC converter of a switching regulator system examined by the present inventors prior to the present invention includes N-channel MOS transistors Q11 and Q12 as high-side switch elements, an N-channel MOS transistor Q2 as a low-side switch element, a smoothing inductor Lout, a smoothing capacitor Cout, and a controller CNT. Furthermore, the DC-DC converter of a switching regulator system shown in FIG. 6 includes a decoupling inductor Lin, a decoupling capacitor Cin, and parasitic inductors L11 and L12. The N-channel MOS transistors Q11 and Q12 as the high-side switch elements can also be set to have the same element size, but as shown in a dotted circle of FIG. 6, it is possible to set the transistor Q12 to have a small element size and set the transistor Q11 to have a large element size.

In the DC-DC converter of a switching regulator system shown in FIG. 6, an input voltage $V_{IN}$ is supplied to one end of the decoupling inductor Lin, the other end of the decoupling inductor Lin is coupled to the drains of the N-channel MOS transistors Q11 and Q12 and to one end of the decoupling capacitor Cin, and the other end of the decoupling capacitor Cin is coupled to an earth potential. Sources of the N-channel MOS transistors Q11 and Q12 as the high-side switch elements are coupled to a drain of the N-channel MOS transistor Q2 as the low-side switch element and to one end of the smoothing inductor Lout, and a source of the N-channel MOS transistor Q2 as the low-side switch element is coupled to the earth potential. The other end of the smoothing inductor Lout is coupled to one end of the smoothing capacitor Cout, and the other end of the smoothing capacitor Cout is coupled to the earth potential.

In contrast, in the DC-DC converter of a switching regulator system shown in FIG. 6, the N-channel MOS transistor Q11 is arranged near the decoupling capacitor Cin, whereas the N-channel MOS transistor Q12 is arranged spaced apart by an unignorable distance from the decoupling capacitor Cin. That is, as shown on the lower part of the circuit diagram of FIG. 6, the N-channel MOS transistor Q11 is arranged near the decoupling capacitor Cin, and the N-channel MOS transistor Q12 is arranged spaced apart by an unignorable distance from the decoupling capacitor Cin. As a result, as shown in FIG. 6, a gap between the drain of the N-channel MOS transistor Q11 and one end of the decoupling capacitor Cin serves as a small parasitic inductor of only one parasitic inductor L11, whereas a gap between the drain of the N-channel MOS transistor Q12 and one end of the decoupling capacitor Cin serves as a large parasitic inductor including two parasitic inductors L11 and L12.

The controller CNT supplies a first high-side driving signal HG11 and a second high-side driving signal HG12 to a gate of the N-channel MOS transistor Q11 and a gate of the N-channel MOS transistor Q11, respectively, and also supplies a low-side driving signal LG to a gate of the N-channel MOS transistor Q2. Note that, the first high-side driving signal HG11 and the second high-side driving signal HG12 are set substantially in-phase, whereas the first and second high-side driving signals HG11, HG12 and the low-side driving signal LG are set substantially anti-phase. Accordingly, in a period during which the N-channel MOS transistors Q11 and Q12 as the high-side switch elements are set to an on-state, the N-channel MOS transistor Q2 as the low-side switch element is set to an off-state, whereas in a period during which the N-channel MOS transistors Q11 and Q12 as the high-side switch elements are set to an off-state, the N-channel MOS transistor Q2 as the low-side switch element is set to an on-state.

As a result, an output voltage Vout of the DC-DC converter of a switching regulator system shown in FIG. 6, the output voltage Vout being generated from one end of the smoothing inductor Lout, is given by the following formula through the use of an on period Ton, an off period Toff, and the input voltage $V_{IN}$ of the N-channel MOS transistors Q11 and Q12 as the high-side switch elements.

$$Vout = Ton * V_{IN}/(Ton+Toff) \quad \text{(Formula 1)}$$

In contrast, the present inventors examined, prior to the present invention, a system in which the transistor Q12 set to a small element size is controlled in an off-state by delaying the transistor Q12 relative to the transistor Q11 set to a large element size, according to the technique described in Patent Document 2 and Patent Document 3 in which two transistors coupled in parallel are driven with a time difference.

FIG. 7 is an operation waveform diagram showing a system, in which the transistor Q12 set to a small element size is controlled in an off-state by delaying the transistor Q12 relative to the transistor Q11 set to a large element size, in the DC-DC converter of a switching regulator system, shown in FIG. 6, examined by the present inventors prior to the present invention.

Accordingly, as shown in FIG. 7, a timing when the low-side driving signal HG12 for driving the transistor Q12 set to a small element size changes from a high level "H" to a low level "L", is set to be delayed from a timing when the high-side driving signal HG11 for driving the transistor Q11 set to a large element size changes from a high level "H" to a low level "L". As a result, even when the transistor Q11 of a large element size changes from an on-state to an off-state, the transistor Q12 of a small element size is in an on-state at the timing of this change, and thus a drain-to-source voltage of the transistor Q11 of a large element size is maintained at zero volt and a reduction of switching loss is possible by an operational principle of zero-volt switching (ZVS: Zero-volt switching).

FIG. 7 shows a current waveform of a drain current Ids11 of the transistor Q11 of a large element size, a current waveform of a drain current Ids12 of the transistor Q12 of a small element size, a current waveform of a total drain current Ids11+Ids12 flowing through the smoothing inductor Lout, and a voltage waveform of a switching voltage $V_{SW}$ at one end of the smoothing inductor Lout.

As shown in FIG. 7, at a timing when the high-side driving signal HG11 changes from a high level "H" to a low level "L", the drain current Ids11 of the transistor Q11 of a large element size, being arranged near the decoupling capacitor Cin and having one small parasitic inductor L11 starts to decrease. In contrast, the current value of the total drain current Ids11+Ids12 flowing through the smoothing inductor Lout attempts to be maintained at a constant value, and thus the drain current Ids12 of the transistor Q12 of a small element size starts to increase in an inverse relation to a decrease in the drain current Ids11. However, the transistor Q12 of a small element size is arranged spaced apart by an unignorable distance from the decoupling capacitor Cin and has the large parasitic inductors L11 and L12, and thus an increase in the drain current Ids12 of the transistor Q12 of a small element size is delayed by a relatively long time as compared with a decrease in the drain current Ids11 of the transistor Q11 of a large element size. As a result, as shown in FIG. 7, the current value of the total drain current Ids11+Ids12 flowing through the smoothing inductor Lout becomes significantly lower than a certain value as illustrated by hatching during a relatively long time period. Accordingly, the voltage value of the switching voltage $V_{SW}$ at one end of the smoothing inductor Lout also becomes significantly lower than the input voltage $V_{IN}$ of a constant voltage value as illustrated by hatching during a relatively long time period, as shown in FIG. 7. That is, when the voltage value of the switching voltage $V_{SW}$ at one end of the smoothing inductor Lout is maintained at the input voltage $V_{IN}$ of a constant voltage value, the drain-to-source voltage of the transistor Q11 of a large element size is maintained at zero volt and thus a reduction of switching loss becomes possible by the operational principle of zero-volt switching (ZVS). However, the voltage value of the switching voltage $V_s$ at one end of the smoothing inductor Lout becomes significantly lower than the input voltage $V_{IN}$ of a constant voltage value as illustrated by hatching during a relatively long time period, as shown in FIG. 7. As a result, the examination by the present inventors prior to the present invention reveals that the drain-to-source voltage of the transistor Q11 of a large element size significantly deviates from zero volt and significantly deviates from the operational principle of zero-volt switching (ZVS) and thus a reduction of switching loss becomes impossible.

FIG. 8 is a view showing a configuration of a DC-DC converter of a switching regulator system examined by the present inventors prior to the present invention.

The DC-DC converter of a switching regulator system, shown in FIG. 8, examined by the present inventors prior to the present invention differs from the DC-DC converter of a switching regulator system, shown FIG. 6, examined by the present inventors prior to the present invention, in the following points.

That is, in the DC-DC converter of a switching regulator system, shown in FIG. 8, examined by the present inventors prior to the present invention, the N-channel MOS transistor Q12 is arranged near the decoupling capacitor Cin, whereas the N-channel MOS transistor Q11 is arranged spaced apart by an unignorable distance from the decoupling capacitor Cin. That is, as shown on the lower part of the circuit diagram of FIG. 8, the N-channel MOS transistor Q12 of a small element size is arranged near the decoupling capacitor Cin, whereas the N-channel MOS transistor Q11 of a large element size is arranged spaced apart by an unignorable distance from the decoupling capacitor Cin. As a result, as shown in FIG. 8, a gap between the drain of the N-channel MOS transistor Q12 of a small element size and one end of the decoupling capacitor Cin serves as a small parasitic inductor of only one parasitic inductor L12. In contrast, a gap between the drain of the N-channel MOS transistor Q11 of a large element size and one end of the decoupling capacitor Cin serves as a large parasitic inductor including two parasitic inductors L11 and L12.

FIG. 9 is an operation waveform diagram showing a system, in which the transistor Q12 set to a small element size is controlled in an off-state by delaying the transistor Q12 relative to the transistor Q11 set to a large element size, in the DC-DC converter of a switching regulator system, shown in FIG. 8, examined by the present inventors prior to the present invention.

Accordingly, as shown in FIG. 9, a timing when the low-side driving signal HG12 for driving the transistor Q12 set to a small element size changes from a high level "H" to a low level "L" is set to be delayed from a timing when the high-side driving signal HG11 for driving the transistor Q11 set to a large element size changes from a high level "H" to a low level "L". As a result, even when the transistor Q11 of a large element size changes from an on-state to an off-state, the transistor Q12 of a small element size is in an on-state at the timing of this change, and therefore the drain-to-source voltage of the transistor Q11 of a large element size is maintained at zero volt and thus a reduction of switching loss becomes possible by the operational principle of zero-volt switching (ZVS: Zero-volt switching).

FIG. 9 shows a current waveform of the drain current Ids11 of the transistor Q11 of a large element size, a current waveform of the drain current Ids12 of the transistor Q12 of a small element size, a current waveform of the total drain current Ids11+Ids12 flowing through the smoothing inductor Lout, and a voltage waveform of the switching voltage $V_{SW}$ at one end of the smoothing inductor Lout.

As shown in FIG. 9, as compared with a timing when the high-side driving signal HG11 changes from a high level "H" to a low level "L", there is delayed a timing when the drain current Ids11 of the transistor Q11 of a large element size, arranged spaced apart by an unignorable distance from the decoupling capacitor Cin, the transistor Q11 having the large parasitic inductors L11 and L12, starts to decrease. In contrast, the current value of the total drain current Ids11+Ids12 flowing through the smoothing inductor Lout attempts to be maintained at a constant value, and thus the drain current Ids12 of the transistor Q12 of a small element size starts to increase in an inverse relation to a decrease in the drain current Ids11. In contrast, the transistor Q12 of a small element size is arranged near the decoupling capacitor Cin and has the small parasitic inductor L12, and thus an increase in the drain current Ids12 of the transistor Q12 of a small element size is delayed by a relatively short time as compared with a decrease in the drain current Ids11 of the transistor Q11 of a large element size. As a result, as shown in FIG. 9, the current value of the total drain current Ids11+Ids12 flowing through the smoothing inductor Lout drops slightly below a certain value as illustrated by hatching during a relatively long time period. Accordingly, the voltage value of the switching voltage $V_{SW}$ at one end of the smoothing inductor Lout also drops slightly below the input voltage $V_{IN}$ of a constant voltage value as illustrated by hatching during a relatively long time period, as shown in FIG. 9. That is, when the voltage value of the switching voltage $V_{SW}$ at one end of the smoothing inductor Lout is maintained at the input voltage $V_{IN}$ of a constant voltage value, the drain-to-source voltage of the transistor Q11 of a large element size is maintained at zero volt and thus a reduction of switching loss is possible by the operational principle of zero-volt switching (ZVS). However, the voltage value of the switching voltage $V_{SW}$ at one end of the smoothing inductor Lout drops slightly below the input voltage $V_{IN}$ of a constant voltage value as illustrated by hatching during a relatively long time period, as shown in FIG. 9. As a result, the examination by the present inventors prior to the present invention reveals that the drain-to-source voltage of the transistor Q11 of a large element size slightly deviates from zero volt and slightly deviates from the operational principle of zero-volt switching (ZVS), and thus a reduction of switching loss becomes impossible.

FIG. 10 is a view showing a configuration in which the transistor Q11 of a large element size and the transistor Q12 of a small element size are formed in the same semiconductor chip Chip, in the DC-DC converter of a switching regulator system, shown in FIG. 8 and FIG. 9, examined by the present inventors prior to the present invention. As shown in the semiconductor chip Chip of FIG. 10, the transistor Q11 of a large element size and the transistor Q12 of a small element size are formed so as to be separated by a predetermined width ΔW. The transistor Q11 of a large element size includes a plurality of gates G11, a plurality of drains D11, and a plurality of sources S11, while the transistor Q12 of a small element size includes a plurality of gates G12, a plurality of drains D12, and a plurality of sources S12.

The gates G11 of the transistor Q11 of a large element size and the gates G12 of the transistor Q12 of a small element size have substantially the same channel length L, the gates G11 of the transistor Q11 of a large element size have a large gate width W11, and the gates G12 of the transistor Q12 of a small element size have a small gate width W12.

As shown in FIG. 10, exactly as with FIG. 8, the N-channel MOS transistor Q12 of a small element size is arranged near the decoupling capacitor Cin, whereas the N-channel MOS transistor Q11 of a large element size is arranged spaced apart by an unignorable distance from the decoupling capacitor Cin. As a result, as shown in FIG. 10, a gap between the drain of the N-channel MOS transistor Q12 of a small element size and one end of the decoupling capacitor Cin serves as a small parasitic inductor of only one parasitic inductor L12. In contrast, a gap between the drain of the N-channel MOS transistor Q11 of a large element size and one end of the decoupling capacitor Cin serves as a large parasitic inductor including two parasitic inductors L11 and L12.

As a result, also in the DC-DC converter of a switching regulator system, in which the transistor Q11 of a large element size and the transistor Q12 of a small element size are formed in the same semiconductor chip Chip, shown in FIG. 10, examined by the present inventors prior to the present invention, the same problems as those of the DC-DC converter of a switching regulator system shown in FIG. 8 and FIG. 9 arise. That is, the study by the present inventors prior to the present invention reveals that even with the DC-DC converter of a switching regulator system shown in FIG. 10, the drain-to-source voltage of the transistor Q11 of a large element size slightly deviates from zero volt and slightly deviates from the operational principle of zero-volt switching (ZVS), and thus a reduction of switching loss becomes impossible.

While the means for solving the above-described problems are described below, the other problems and the new feature will become clear from the description of the present specification and the accompanying drawings.

The following explains briefly the outline of a typical embodiment disclosed in the present application.

That is, a semiconductor integrated circuit according to the typical embodiment includes high-side switch elements (Q11 and Q12), a low-side switch element (Q2), and a controller (CNT).

A decoupling capacitor (Cin) is coupled between one end of the high-side switch elements (Q11 and Q12) and an earth potential.

The high-side switch elements (Q11 and Q12) include a first transistor (Q11) and a second transistor (Q12) whose current paths are coupled in parallel.

In changing the high-side switch elements from an on-state to an off-state, the controller (CNT) controls the second transistor (Q12) from an on-state to an off-state by delaying the second transistor (Q12) relative to the first transistor (Q11).

Each transistor of the first transistor (Q11) and the second transistor (Q12) is formed to be divided into a plurality of parts, inside a semiconductor chip (Chip 1).

A plurality of partial first transistors formed by dividing the first transistor (Q11) and a plurality of partial second transistors formed by dividing the second transistor (Q12) are alternately arranged in an arrangement direction of the first transistor (Q11) and the second transistor (Q12) inside the semiconductor chip (Chip 1) (see FIG. 1).

The following explains briefly the effect obtained by the typical embodiment among the embodiments disclosed in the present application.

That is, according to the semiconductor integrated circuit, a deviation from the operational principle of zero-volt switching (ZVS) can be reduced and a switching loss can be reduced.

DETAILED DESCRIPTION

1. Overview of Embodiments

First, the overview of a typical embodiment disclosed in the present application is described. In the overview description of the typical embodiment, a symbol referred to with parentheses in the accompanying drawings simply illustrates those included in the concept of a component with the symbol attached thereto.

[1] A semiconductor integrated circuit according to the typical embodiment includes high-side switch elements (Q11 and Q12), a low-side switch element (Q2), and a controller (CNT).

An input voltage ($V_{IN}$) can be supplied to one end of the high-side switch elements (Q11 and Q12), via a decoupling inductor (Lin), the other end of the high-side switch elements (Q11 and Q12) and one end of the low-side switch element (Q2) are coupled to a switching node ($V_{SW}$), and the other end of the low-side switch element (Q2) can be coupled to an earth potential.

The controller (CNT) can drive the high-side switch elements (Q11 and Q12) in an on-state and an off-state.

The switching node ($V_{SW}$) can be coupled to a low pass filter including a smoothing inductor (Lout) and a smoothing capacitor (Gout).

A decoupling capacitor (Cin) can be coupled between the one end of the high-side switch elements (Q11 and Q12) and the earth potential.

The high-side switch elements (Q11 and Q12) include a first transistor (Q11) and a second transistor (Q12) whose current paths are coupled in parallel between the one end of the high-side switch elements and the other end of the high-side switch elements.

In changing a state between the one end of the high-side switch elements and the other end of the high-side switch elements from an on-state to an off-state, the controller (CNT) controls the second transistor (Q12) from an on-state to an off-state by delaying the second transistor (Q12) relative to the first transistor (Q11).

Each transistor of the first transistor (Q11) and the second transistor (Q12) is formed to be divided into a plurality of parts, inside a semiconductor chip (Chip 1).

Figure 1:
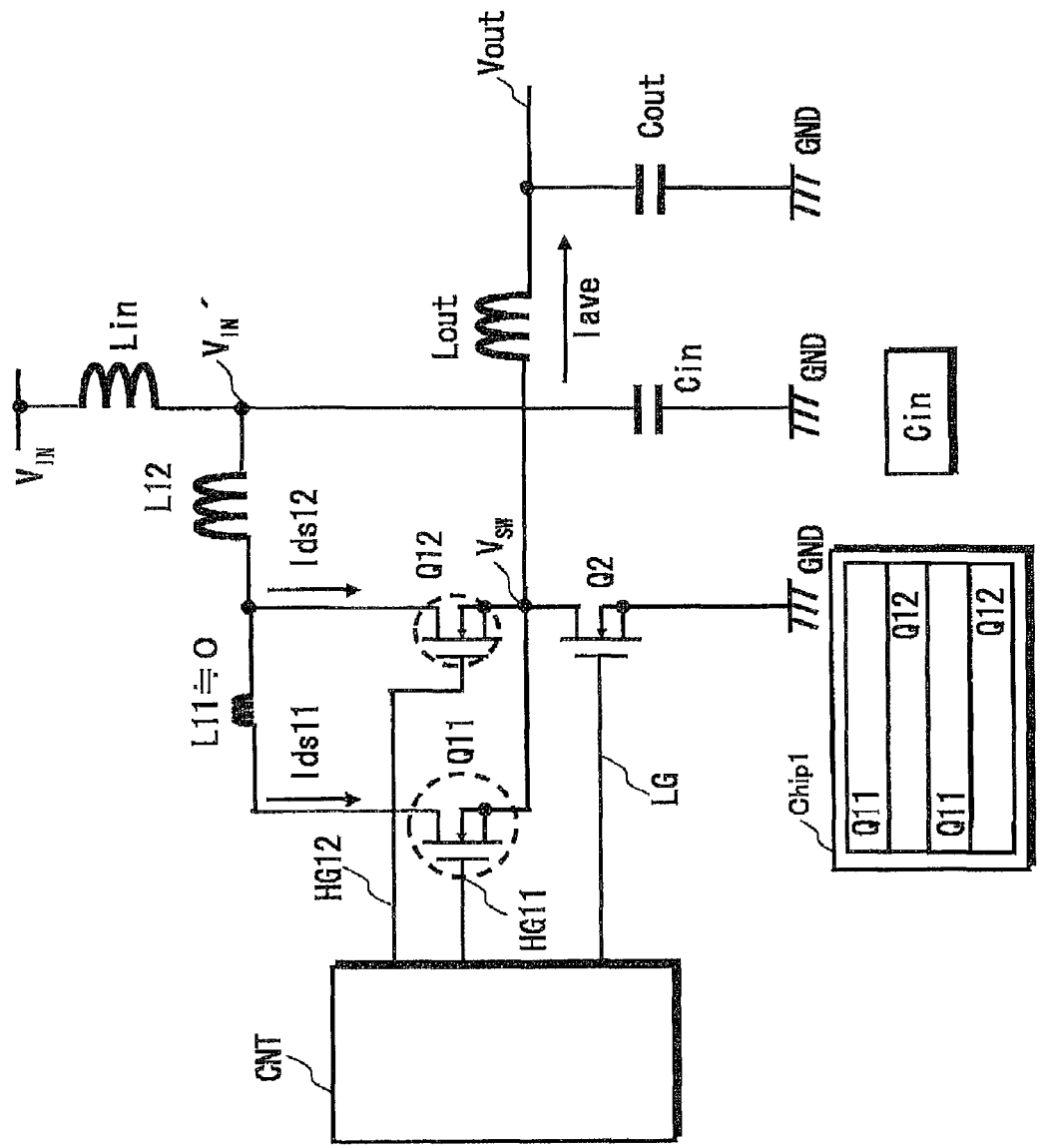
FIG. 1 is a view showing the configuration of a DC-DC converter of a switching regulator system of a first embodiment.

A plurality of partial first transistors formed by dividing the first transistor (Q11) and a plurality of partial second transistors formed by dividing the second transistor (Q12) are alternately arranged in an arrangement direction of the first transistor (Q11) and the second transistor (Q12), inside the semiconductor chip (Chip 1) (see FIG. 1).

According to the embodiment, a deviation from the operational principle of zero-volt switching (ZVS) can be reduced and a switching loss can be reduced.

In a preferred embodiment, the low-side switch element includes a third transistor (Q2) whose current path is coupled between the switching node ($V_{SW}$) and the earth potential (see FIG. 1).

According to another preferred embodiment, the controller (CNT) generates a first high-side driving signal (HG11) for driving a control input terminal of the first transistor (Q11), a second high-side driving signal (HG12) for driving a control input terminal of the second transistor (Q12), and a low-side driving signal (LG) for driving a control input terminal of the third transistor (Q2).

The first high-side driving signal (HG11) and the second high-side driving signal (HG12) are substantially in-phase, whereas the first high-side driving signal (HG11) as well as the second high-side driving signal (HG12), and the low-side driving signal (LG) are substantially anti-phase (see FIG. 1).

According to yet another preferred embodiment, an output voltage (Vout) of the DC-DC converter generated from the low pass filter (Lout, Cout) is set by an on period (Ton) during which the high-side switch element is in the on-state, an off period (Toff) during which the high-side switch element is in the off-state, and the input voltage ($V_{IN}$) (see FIG. 1).

According to a further preferred embodiment, the first transistor (Q11), the second transistor (Q12), and the third transistor (Q2) are N-channel MOS transistors, respectively (see FIG. 1).

According to another further preferred embodiment, the first transistor (Q11) and the second transistor (Q12) as the high-side switch elements are formed in a first semiconductor chip (Chip 1), the third transistor (Q2) as the low-side switch element is formed in a second semiconductor chip (Chip 2), and the controller (CNT) is formed in a third semiconductor chip (Chip 3).

Figure 3:
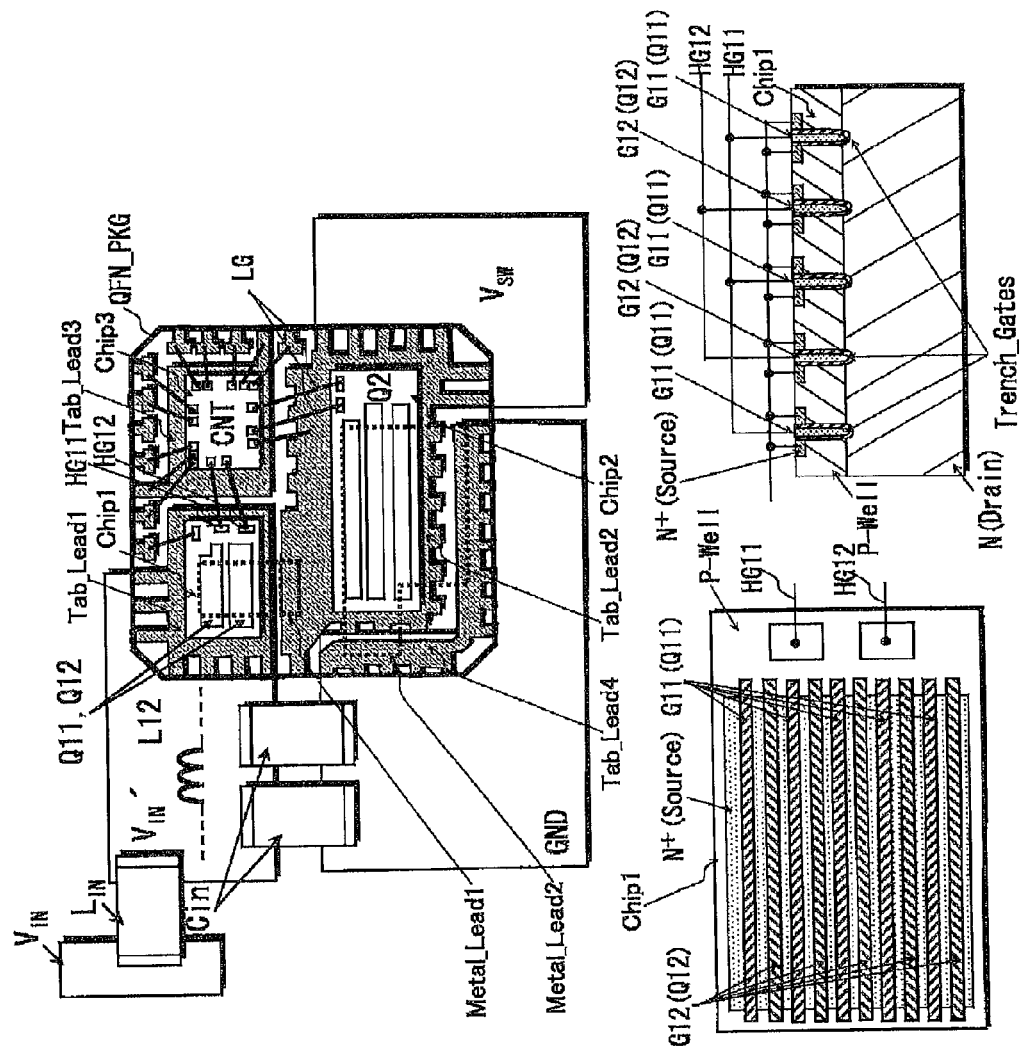
FIG. 3 is a view showing the configuration of a DC-DC converter of a switching regulator system of a second embodiment.

The first semiconductor chip (Chip 1), the second semiconductor chip (Chip 2), and the third semiconductor chip (Chip 3) are sealed into one package (QFN_PKG) (see FIG. 3).

According to yet another further preferred embodiment, the first transistor (Q11) and the second transistor (Q12) as the high-side switch elements are formed by a trench-gate-type N-channel vertical MOS transistor structure.

The trench gates (G11) of the first transistor (Q11) and the trench gates (G12) of the second transistor (Q12) are alternately arranged in the arrangement direction of the first transistor (Q11) and the second transistor (Q12) inside the first semiconductor chip (Chip 1) (see FIG. 3).

According to another further preferred embodiment, the third transistor (Q2) as the low-side switch element is formed by the trench-gate-type N-channel vertical MOS transistor structure.

According to yet another further preferred embodiment, the one package (QFN_PKG), the decoupling inductor (Lin), the decoupling capacitor (Cin), the smoothing inductor (Lout), and the smoothing capacitor (Cout) constitute a DC-DC converter of a switching regulator system.

According to yet another further preferred embodiment, the first transistor (Q11) and the second transistor (Q12) as the high-side switch elements, the third transistor (Q2) as the low-side switch element, and the controller (CNT) are formed by being integrated into a single semiconductor chip (Chip).

Figure 4:
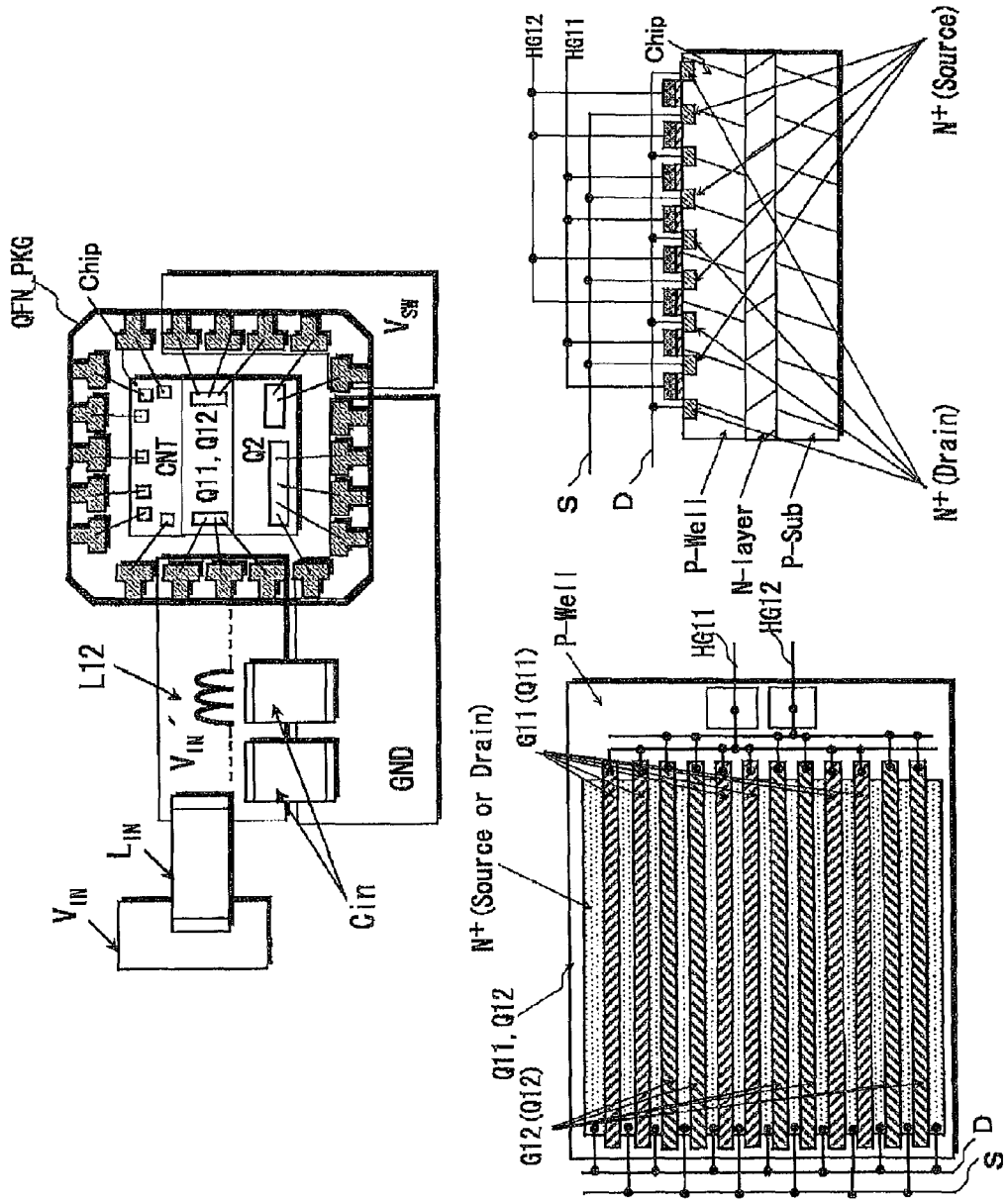
FIG. 4 is a view showing the configuration of a DC-DC converter of a switching regulator system of a third embodiment.

The single semiconductor chip (Chip) is sealed into one package (QFN_PKG) (see FIG. 4).

According to a specific embodiment, the first transistor (Q11) and the second transistor (Q12) as the high-side switch elements are formed by a planer N-channel lateral MOS transistor structure.

The gates (G11) of the first transistor (Q11) and the gates (G12) of the second transistor (Q12) are alternately arranged in the arrangement direction of the first transistor (Q11) and the second transistor (Q12), inside the single semiconductor chip (Chip).

Furthermore, according to yet another specific embodiment, the third transistor (Q2) as the low-side switch element is formed by the planer N-channel lateral MOS transistor structure inside the single semiconductor chip (Chip).

According to the most specific embodiment, the single semiconductor chip (Chip), the decoupling inductor (Lin), the decoupling capacitor (Cin), the smoothing inductor (Lout), and the smoothing capacitor (Cout) constitute a DC-DC converter of a switching regulator system.

[2] A typical embodiment according to another aspect of the present invention is a method for operating a semiconductor integrated circuit including high-side switch elements (Q11 and Q12), a low-side switch element (Q2), and a controller (CNT).

An input voltage ($V_{IN}$) can be supplied to one end of the high-side switch elements (Q11 and Q12) via a decoupling inductor (Lin), the other end of the high-side switch elements (Q11 and Q12) and one end of the low-side switch element (Q2) are coupled to a switching node ($V_{SW}$), and the other end of the low-side switch element (Q2) can be coupled to an earth potential.

The controller (CNT) can drive the high-side switch elements (Q11 and Q12) in an on-state and an off-state.

The switching node ($V_{SW}$) can be coupled to a low pass filter including a smoothing inductor (Lout) and a smoothing capacitor (Gout).

The decoupling capacitor (Cin) can be coupled between the one end of the high-side switch elements (Q11 and Q12) and the earth potential.

The high-side switch elements (Q11 and Q12) include a first transistor (Q11) and a second transistor (Q12) whose current paths are coupled in parallel between the one end of the high-side switch elements and the other end of the high-side switch elements.

In changing a state between the one end of the high-side switch element and the other end of the high-side switch element from an on-state to an off-state, the controller (CNT) controls the second transistor (Q12) from an on-state to an off-state by delaying the second transistor (Q12) relative to the first transistor (Q11).

Each transistor of the first transistor (Q11) and the second transistor (Q12) is formed to be divided into a plurality of parts, inside the semiconductor chip (Chip 1).

A plurality of partial first transistors formed by dividing the first transistor (Q11) and a plurality of partial second transistors formed by dividing the second transistor (Q12) are alternately arranged in an arrangement direction of the first transistor (Q11) and the second transistor (Q12) inside the semiconductor chip (Chip 1) (see FIG. 1).

According to the above-described embodiment, a deviation from the operational principle of zero-volt switching (ZVS) can be reduced and a switching loss can be reduced.

2. Details of Embodiments

Next, the embodiments will be described more in detail. Note that, in all the drawings for explaining the preferred embodiments for implementing the present invention, the same symbol is attached to a component having the same function as that of the preceding drawing to omit the repeated explanation thereof.

[First Embodiment]

<<Configuration of DC-DC Converter>>

FIG. 1 is a view showing the configuration of a DC-DC converter of a switching regulator system of a first embodiment.

As shown in FIG. 1, the DC-DC converter of a switching regulator system according to the first embodiment includes the N-channel MOS transistors Q11 and Q12 as the high-side switch elements, the N-channel MOS transistor Q2 as a low-side switch element, the smoothing inductor Lout, the smoothing capacitor Cout, and the controller CNT. Furthermore, the DC-DC converter of a switching regulator system shown in FIG. 1 includes the decoupling inductor Lin, the decoupling capacitor Cin, and the parasitic inductors L11 and L12. Accordingly, a DC input voltage $V_{IN}'$, which is obtained by reducing the high frequency ripple components of the input voltage $V_{IN}$ by a low pass filter function of the decoupling inductor Lin and the decoupling capacitor Cin, is supplied to the drains of the N-channel MOS transistors Q11 and Q12 as the high-side switch elements. The N-channel MOS transistors Q11 and Q12 as the high-side switch elements can be also set to the same element size, but as shown in a dotted circle of FIG. 1, it is possible to set the transistor Q12 to a small element size while being possible to set the transistor Q11 to a large element size. Furthermore, as the low-side switch element, a diode can be also used instead of the N-channel MOS transistor Q2. Preferably, a schottky diode having a low forward voltage is used in order to reduce a power loss, and its anode is coupled to the earth potential and its cathode is coupled to the sources of the N-channel MOS transistors Q11 and Q12 as the high-side switch elements.

In the DC-DC converter of a switching regulator system shown in FIG. 1, the input voltage $V_{IN}$ is supplied to one end of the decoupling inductor Lin, the other end of the decoupling inductor Lin is coupled to the drains of the N-channel MOS transistors Q11 and Q12 and to one end of the decoupling capacitor Cin, and the other end of the decoupling capacitor Cin is coupled to an earth potential. The sources of the N-channel MOS transistors Q11 and Q12 as the high-side switch elements are coupled to the drain of the N-channel MOS transistor Q2 as the low-side switch element and to one end of the smoothing inductor Lout, and the source of the N-channel MOS transistor Q2 as the low-side switch element is coupled to the earth potential. The other end of the smoothing inductor Lout is coupled to one end of the smoothing capacitor Cout, and the other end of the smoothing capacitor Cout is coupled to the earth potential.

In contrast, in the DC-DC converter of a switching regulator system shown in FIG. 1, the N-channel MOS transistors Q11 and Q12 and the decoupling capacitor Cin are arranged so that an arrangement distance between the N-channel MOS transistor Q11 and the decoupling capacitor Cin becomes substantially equal to an arrangement distance between the N-channel MOS transistor Q12 and the decoupling capacitors Cin. That is, as shown on the lower part of the circuit diagram of FIG. 1, inside the semiconductor chip Chip 1, the N-channel MOS transistor Q11 is formed to be divided into a plurality of parts and the N-channel MOS transistor Q12 is also formed to be divided into a plurality of parts. Here, a wiring distance and a wiring parasitic inductance between the N-channel MOS transistor Q11 and the decoupling capacitor Cin are proportional to an arrangement distance between the N-channel MOS transistor Q11 and the decoupling capacitor Cin. Moreover, a wiring distance and a wiring parasitic inductance between the N-channel MOS transistor Q12 and the decoupling capacitor Cin are proportional to an arrangement distance between the N-channel MOS transistor Q12 and the decoupling capacitor Cin.

In particular, in the semiconductor chip Chip 1 of the DC-DC converter of a switching regulator system of the first embodiment, each transistor of the first transistor Q11 and the second transistor Q12 is formed to be divided into a plurality of parts, inside the semiconductor chip Chip 1. As shown in FIG. 1, the partial first transistors formed by dividing the first divided transistor Q11 and the partial second transistors formed by dividing the second divided transistor Q12 are alternately arranged in the arrangement direction of the first transistor Q11 and the second transistor Q12.

In the example shown in FIG. 1, the decoupling capacitor Cin is arranged on the right short side of the quadrangular semiconductor chip Chip 1, and a parasitic inductor between the transistor Q11 formed by dividing one transistor into the plurality of parts and the decoupling capacitors Cin and a parasitic inductor between the transistor Q12 formed by dividing one transistor into the plurality of parts and the decoupling capacitors Cin become substantially equal. As a result, as shown in FIG. 1, the value of the parasitic inductor L11 between the transistor Q11 and the transistor Q12 becomes a substantially negligible value, and there is only one parasitic inductor L12 between both the drains of the transistors Q11 and Q12 and the decoupling capacitor Cin. In other example, the decoupling capacitor Cin is arranged on the upper long side of the quadrangular semiconductor chip Chip 1, and a number of divisions of the transistor Q11 and a number of divisions of the transistor Q12 are set equal to or greater than 10, respectively. Also in this case, as shown in FIG. 1, the value of the parasitic inductor L11 between the transistor Q11 and the transistor Q12 becomes a substantially negligible value, and there is only one parasitic inductor L12 between both the drains of the transistors Q11 and Q12 and the decoupling capacitor Cin.

The controller CNT supplies the first high-side driving signal HG11 and the second high-side driving signal HG12 to the gate of the N-channel MOS transistor Q11 and to the gate of the N-channel MOS transistor Q11, respectively, and also supplies the low-side driving signal LG to the gate of the N-channel MOS transistor Q2. Note that, the first high-side driving signal HG11 and the second high-side driving signal HG12 are set substantially in-phase, whereas the first and second high-side driving signals HG11 and HG12 and the low-side driving signal LG are set substantially anti-phase. Accordingly, in a period during which the N-channel MOS transistors Q11 and Q12 as the high-side switch elements are set to an on-state, the N-channel MOS transistor Q2 as the low-side switch element is set to an off-state, whereas in a period during which the N-channel MOS transistors Q11 and Q12 as the high-side switch elements are set to an off-state, the N-channel MOS transistor Q2 as the low-side switch element is set to an on-state.

As a result, the output voltage Vout of the DC-DC converter of a switching regulator system according to the first embodiment shown in FIG. 1, the output voltage Vout being generated from one end of the smoothing inductor Lout, is given by the following formula through the use of an the period Ton, the off period Toff, and the input voltage $V_{IN}$ of the N-channel MOS transistors Q11 and Q12 as the high-side switch elements.

$$Vout=Ton*V_{IN}/(Ton+Toff) \quad \text{(Formula 2)}$$

<<Operation Waveform Diagram>>

Figure 2:
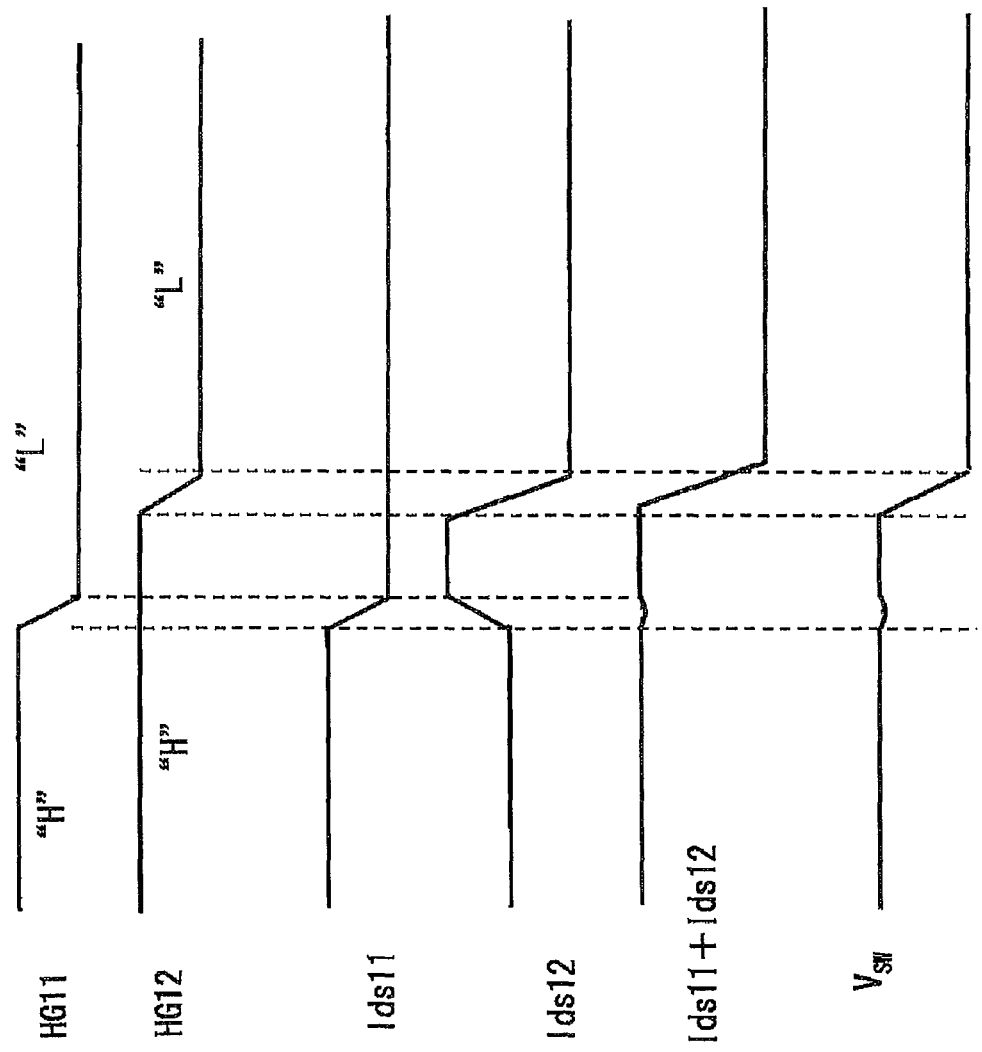
FIG. 2 is an operation waveform diagram showing a system in which the controller CNT controls the transistor Q12 set to a small element size in an off-state by delaying the transistor Q12 relative to the transistor Q11 set to a large element size, in the DC-DC converter of a switching regulator system according to the first embodiment shown in FIG. 1.

FIG. 2 is an operation waveform diagram showing a system, in which the controller CNT controls, in an off-state, the transistor Q12 set to a small element size by delaying the transistor Q12 relative to the transistor Q11 set to a large element size, in the DC-DC converter of a switching regulator system according to the first embodiment shown in FIG. 1. Note that an element size (the number of divisions) of the transistor Q11 can be also set to the same as an element size (the number of divisions) of the transistor Q12.

Accordingly, as shown in FIG. 2, a timing when the low-side driving signal HG12 for driving the transistor Q12 set to a small element size changes from a high level "H" to a low level "L" is set to be delayed from a timing when the high-side driving signal HG11 for driving the transistor Q11 set to a large element size changes from a high level "H" to a low level "L". As a result, even when the transistor Q11 of a large element size changes from an on-state to an off-state, the transistor Q12 of a small element size is in an on-state at the timing of this change, and thus the drain-to-source voltage of the transistor Q11 of a large element size is maintained at zero volt and a reduction of the switching loss becomes possible by the operational principle of zero-volt switching (ZVS).

FIG. 2 shows a current waveform of the drain current Ids11 of the transistor Q11 of a large element size, a current waveform of the drain current Ids12 of the transistor Q12 of a small element size, a current waveform of the total drain current Ids11+Ids12 flowing through the smoothing inductor Lout, and a voltage waveform of the switching voltage $V_{SW}$ at one end of the smoothing inductor Lout.

As shown in FIG. 2, at a timing when the high-side driving signal HG11 changes from a high level "H" to a low level "L", the drain current Ids11 of the transistor Q11 of a large element size starts to decrease. In contrast, the current value of the total drain current Ids11+Ids12 flowing through the smoothing inductor Lout attempts to be maintained at a constant value, and thus the drain current Ids12 of the transistor Q12 of a small element size starts to increase in an inverse relation to a decrease in the drain current Ids11.

In particular, in the DC-DC converter of a switching regulator system according to the first embodiment shown in FIG. 1, the transistor Q11 of a large element size and the transistor Q12 of a small element size have only one parasitic inductor L12, and the value of the parasitic inductor L11 between the transistor Q11 and the transistor Q12 becomes a substantially negligible value. As a result, a rate of decrease in the drain current Ids11 of the transistor Q11 of a large element size and a rate of increase of the drain current Ids12 of the transistor Q12 of a small element size become substantially equal. Accordingly, as shown in FIG. 2, the current value of the total drain current Ids11+Ids12 flowing through the smoothing inductor Lout becomes slightly lower than a certain value as illustrated by hatching during a relatively short time period. Accordingly, the voltage value of the switching voltage $V_{SW}$ at one end of the smoothing inductor Lout also becomes slightly lower than the input voltage $V_{IN}$ of a constant voltage value as illustrated by hatching during a relatively short time period, as shown in FIG. 2. As a result, a significant deviation of the drain-to-source voltage of the transistor Q11 of a large element size from zero volt is alleviated, and a reduction of the switching loss caused by a deviation from the operational principle of zero-volt switching (ZVS) is possible.

[Second Embodiment]

FIG. 3 is a view showing the configuration of a DC-DC converter of a switching regulator system of a second embodiment.

The DC-DC converter of a switching regulator system of the second embodiment shown in FIG. 3 differs from the DC-DC converter of a switching regulator system according to the first embodiment shown in FIG. 1 in the following points.

As shown in FIG. 3, the N-channel MOS transistors Q11 and Q12 as the high-side switch elements, the N-channel MOS transistor Q2 as the low-side switch element, and the controller CNT are sealed inside a sealing resin of a QFN (Quad Flat No-leads) package QFN_PKG. The QFN package is a rectangular package, on each side of which a plurality of metal connection terminals is formed.

The N-channel MOS transistors Q11 and Q12 as the high-side switch elements are integrated into a first semiconductor chip Chip 1, the N-channel MOS transistor Q2 as the low-side switch element is integrated into a second semiconductor chip Chip 2, and the controller CNT is integrated into a third semiconductor chip Chip 3. The third semiconductor chip Chip 3 of the controller CNT and the first semiconductor chip Chip 1 of the N-channel MOS transistors Q11 and Q12 as the high-side switch elements are mutually coupled by high-side driving signal wirings HG11 and HG12. The third semiconductor chip Chip 3 of the controller CNT and the second semiconductor chip Chip 2 of the N-channel MOS transistor Q2 as the low-side switch element are mutually coupled by a low-side driving signal wiring LG.

A first tab lead Tab_Lead 1 having the first semiconductor chip Chip 1 of the N-channel MOS transistors Q11 and Q12 as the high-side switch elements mounted thereon is electrically coupled to a DC input voltage wiring $V_{IN}$' formed on a wiring substrate of the DC-DC converter of a switching regulator system. A second tab lead Tab_Lead 2 having the second semiconductor chip Chip 2 of the N-channel MOS transistor Q2 as the low-side switch element mounted thereon is electrically coupled to a switching voltage wiring $V_{SW}$ formed on the wiring substrate of the DC-DC converter of a switching regulator system. The third semiconductor chip Chip 3 of the controller CNT is mounted on a third tab lead Tab_Lead 3. A fourth tab lead Tab_Lead 4 serving as a grounding wiring is electrically coupled to a ground potential wiring GND formed on the wiring substrate of the DC-DC converter of a switching regulator system. The decoupling capacitor Cin constituted by two chip capacitors is coupled to the DC input voltage wiring VIN' and the ground potential wiring GND, and the decoupling inductor Lin constituted by a chip inductor is coupled to the input voltage wiring $V_{IN}$ and the DC input voltage wiring $V_{IN}$'.

In addition, a lower bottom surface of the first semiconductor chip Chip 1, the lower bottom surface being the drain of each of the N-channel MOS transistors Q11 and Q12 as the high-side switch elements, is electrically coupled to the DC input voltage wiring $V_{IN}$' of the wiring substrate via the first tab lead Tab_Lead 1. The sources of the transistors Q11 and Q12 formed on the upper major surface of the first semiconductor chip Chip 1 are electrically coupled to the second tab lead Tab_Lead 2 via a first metal lead Metal_Lead 1. A lower bottom surface of the second semiconductor chip Chip 2, the lower bottom surface being the drain of the N-channel MOS transistor Q2 as the low-side switch element, is electrically coupled to the second tab lead Tab_Lead 2. The source of the transistor Q2 formed on the upper major surface of the second semiconductor chip Chip 2 is electrically coupled to the ground potential wiring GND via a second metal lead Metal_Lead 2 and the fourth tab lead Tab_Lead 4.

As shown on the lower left of FIG. 3, the N-channel MOS transistors Q11 and Q12 as the high-side switch elements are integrated and formed in the first semiconductor chip Chip 1. The N-channel MOS transistor Q11 has the gate electrode G11 formed to be divided into a plurality of parts, and the N-channel MOS transistor Q12 also has the gate electrode G12 formed to be divided into a plurality of parts. A first pad, to which the first high-side driving signal HG11 is supplied, although not illustrated in FIG. 3, is coupled to the gate electrodes G11 of the N-channel MOS transistor Q11, while a second pad, to which the second high-side driving signal HG12 is supplied, although not illustrated in FIG. 3, is coupled to the gate electrodes G12 of the N-channel MOS transistor Q12. Furthermore, as shown on the lower left of FIG. 3, between the gate electrode G11 and the gate electrode G12, there is formed an $N^+$ region $N^+$ (Source) as the source of each of the N-channel MOS transistors Q11 and Q12 as the high-side switch elements.

As will be described in detail in the lower right-hand corner of FIG. 3, the N-channel MOS transistors Q11 and Q12 as the high-side switch elements are formed by the so-called trench-gate-type N-channel vertical MOS transistor structure.

In the lower right-hand corner of FIG. 3, there is shown a cross-sectional structure of the first semiconductor chip Chip 1, in which the N-channel MOS transistors Q11 and Q12 as the high-side switch elements are integrated and formed. As shown on the lower right of FIG. 3, a lower bottom surface of the first semiconductor chip Chip 1 serves as a drain N (Drain) of the N-channel MOS transistors Q11 and Q12 as the high-side switch elements. On the upper part of the drain N (Drain) of the N-channel MOS transistors Q11 and Q12, a P-type well region P-Well is formed. A plurality of trenches (grooves) is formed so as to reach the drain N (Drain) from the surface of the P-type well region P-Well. A gate insulating film and a gate electrode are sequentially formed inside the trenches (groove). In the example of FIG. 3, with regard to the gate electrodes formed inside the trenches (grooves), the gate electrode G11 of the MOS transistor Q11 and the gate electrode G12 of the MOS transistor Q12 are sequentially and repeatedly formed. The gate electrodes G11 of the N-channel MOS transistor Q11 are coupled to the first pad to which the first high-side driving signal HG11 is supplied, and the gate electrodes G12 of the N-channel MOS transistor Q12 are coupled to the second pad to which second high-side driving signal HG12 is supplied. Between the trenches (grooves), an $N^+$ region $N^+$ (Source) as the sources of the N-channel MOS transistors Q11 and Q12 as the high-side switch elements is formed. In the lower right-hand corner of FIG. 3, although not illustrated, the N-channel MOS transistor Q2 as the low-side switch element is also formed by the so-called trench-gate-type N-channel vertical MOS transistor structure, exactly as with the N-channel MOS transistors Q11 and Q12 as the high-side switch elements. As a result, a lower bottom surface of the second semiconductor chip Chip 2, in which the N-channel MOS transistor Q2 as the low-side switch element is integrated, serves as the drain N (Drain) of the N-channel MOS transistor Q2 as the low-side switch element.

When the first high-side driving signal HG11 of a high voltage is supplied to the first pad, an N-type inversion channel is formed in a P-type well region P-Well of an internal side-wall of the plurality of trenches (groove), in which the gate electrodes G11 of the N-channel MOS transistor Q11 are formed, and a portion between the source and drain of the N-channel MOS transistor Q11 becomes an electrically conductive state.

When the second high-side driving signal HG12 of a high voltage is supplied to the second pad, an N-type inversion channel is formed in the P-type well region P-Well of the internal side-wall of the plurality of trenches (groove), in which the gate electrodes G12 of the N-channel MOS transistor Q12 are formed, and a portion between the source and drain of the N-channel MOS transistor Q12 becomes an electrically conductive state.

As shown in FIG. 3, the DC-DC converter of a switching regulator system of the second embodiment incorporates three chips Chip 1, Chip 2, and Chip 3, and thus can be used for the application of a relatively high output power.

[Third Embodiment]

FIG. 4 is a view showing the configuration of a DC-DC converter of a switching regulator system of a third embodiment.

The DC-DC converter of a switching regulator system of the third embodiment shown in FIG. 4 differs from the DC-DC converter of a switching regulator system according to the second embodiment shown in FIG. 3, in the following points.

As shown in FIG. 4, the N-channel MOS transistors Q11 and Q12 as the high-side switch elements, the N-channel MOS transistor Q2 as the low-side switch element, and the controller CNT are integrated into a single semiconductor chip Chip. A plurality of external terminals of the controller CNT is coupled to a plurality of metal connection terminals formed on the upper side of the QFN package QFN_PKG, and the drains of the N-channel MOS transistors Q11 and Q12 of the high-side switch elements are coupled to the DC input voltage wiring $V_{IN}'$ via a plurality of metal connection terminals formed on the left side of the QFN package QFN_PKG. The sources of the N-channel MOS transistors Q11 and Q12 of the high-side switch elements and the drain of the N-channel MOS transistor Q2 as the low-side switch element are electrically coupled to the switching voltage wiring $V_{SW}$ via a plurality of metal connection terminals formed on the right side of the QFN package QFN_PKG. Furthermore, the source of the N-channel MOS transistor Q2 as the low-side switch element is electrically coupled to the ground potential wiring GND via a plurality of metal connection terminals formed on the lower side of the QFN package QFN_PKG.

As shown on the lower left of FIG. 4, the N-channel MOS transistors Q11 and Q12 as the high-side switch elements are integrated and formed in the single semiconductor chip Chip. The N-channel MOS transistor Q11 has the gate electrode G11 formed to be divided into a plurality of parts, and the N-channel MOS transistor Q12 also has the gate electrode G12 formed to be divided into a plurality of parts. The first pad to which the first high-side driving signal HG11 is supplied is coupled to the gate electrodes G11 of the N-channel MOS transistor Q11 as shown in FIG. 4, and the second pad to which second high-side driving signal HG12 is supplied is coupled to the gate electrodes G12 of the N-channel MOS transistor Q12 as shown in FIG. 4. Furthermore, as shown on the lower left of FIG. 4, between the gate electrode G11 and the gate electrodes G12, an $N^+$ region $N^+$ (Source or Drain) as the source or drain of the N-channel MOS transistors Q11 and Q12 as the high-side switch elements is formed. Moreover, in the example on the lower left of FIG. 4, a set of two gate electrodes G11 of the MOS transistor Q11 and a set of two gate electrodes G12 of the MOS transistor Q12 are sequentially and repeatedly formed.

As will be described in detail in the lower right-hand corner of FIG. 4, the N-channel MOS transistors Q11 and Q12 as the high-side switch elements are formed by the so-called planer-type N-channel lateral MOS transistor structure.

In the lower right-hand corner of FIG. 4, there is shown a cross-sectional structure of the single semiconductor chip Chip, in which the N-channel MOS transistors Q11 and Q12 as the high-side switch elements are integrated and formed. As shown in the lower right-hand corner of FIG. 4, the lower portion of the single semiconductor chip Chip is a P-type silicon substrate P-Sub, an N-type impurity layer N-Layer is formed on the upper part of the P-type silicon substrate P-Sub. A P-type well region P-Well is formed on the upper part of the N-type impurity layer N-Layer. A stacked structure of a plurality of gate insulating films and the gate electrodes of the N-channel MOS transistors Q11 and Q12 of the high-side switch elements, as well as a source $N^+$ region $N^+$ (Source) and a drain $N^+$ region $N^+$ (Drain) are formed on the surface of the P-type well region P-Well. In the lower right-hand corner of FIG. 4, although not illustrated, the N-channel MOS transistor Q2 as the low-side switch element is also formed inside the single semiconductor chip Chip by the so-called planer-type N-channel lateral MOS transistor structure, exactly as with the N-channel MOS transistors Q11 and Q12 as the high-side switch elements.

When the first high-side driving signal HG11 of a high voltage is supplied to the first pad, an N-type inversion channel is formed on the surface of the P-type well region P-Well directly under the gate electrodes of the N-channel MOS transistor Q11, and a portion between the source and drain of the N-channel MOS transistor Q11 becomes an electrically conductive state.

When the second high-side driving signal HG12 of a high voltage is supplied to the second pad, an N-type inversion channel is formed on the surface of the P-type well region P-Well directly under the gate electrodes of the N-channel MOS transistor Q12, and a portion between the source and drains of the N-channel MOS transistor Q12 becomes an electrically conductive state.

As shown in FIG. 4, the DC-DC converter of a switching regulator system of the third embodiment incorporates the single semiconductor chip Chip, and thus can be used for the application of a relatively low output power.

<<Operation Waveform Diagram>>

Figure 5:
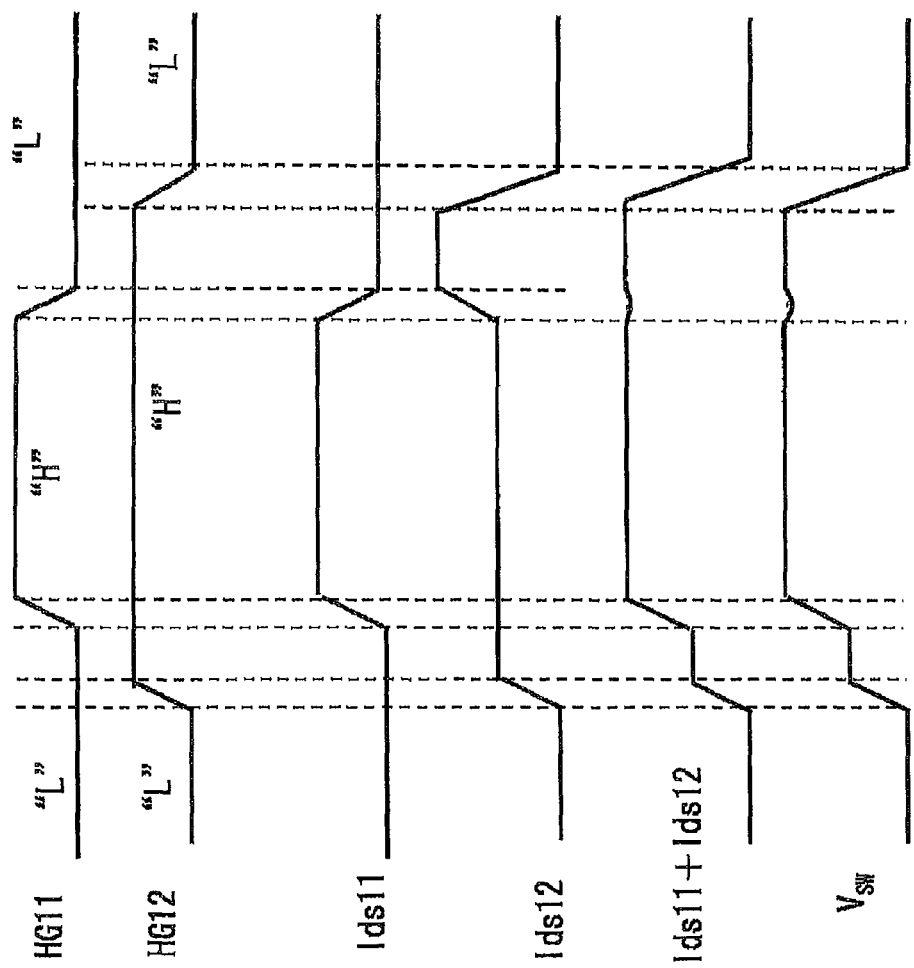
FIG. 5 is an operation waveform diagram when the controller CNT drives the N-channel MOS transistors Q11 and Q12 as the high-side switch elements and the N-channel MOS transistor Q2 as the low-side switch element, in the DC-DC converter of a switching regulator system according to any of the first embodiment, the second embodiment, and the third embodiment shown in FIG. 1, FIG. 3, and FIG. 4.
Figure 6:
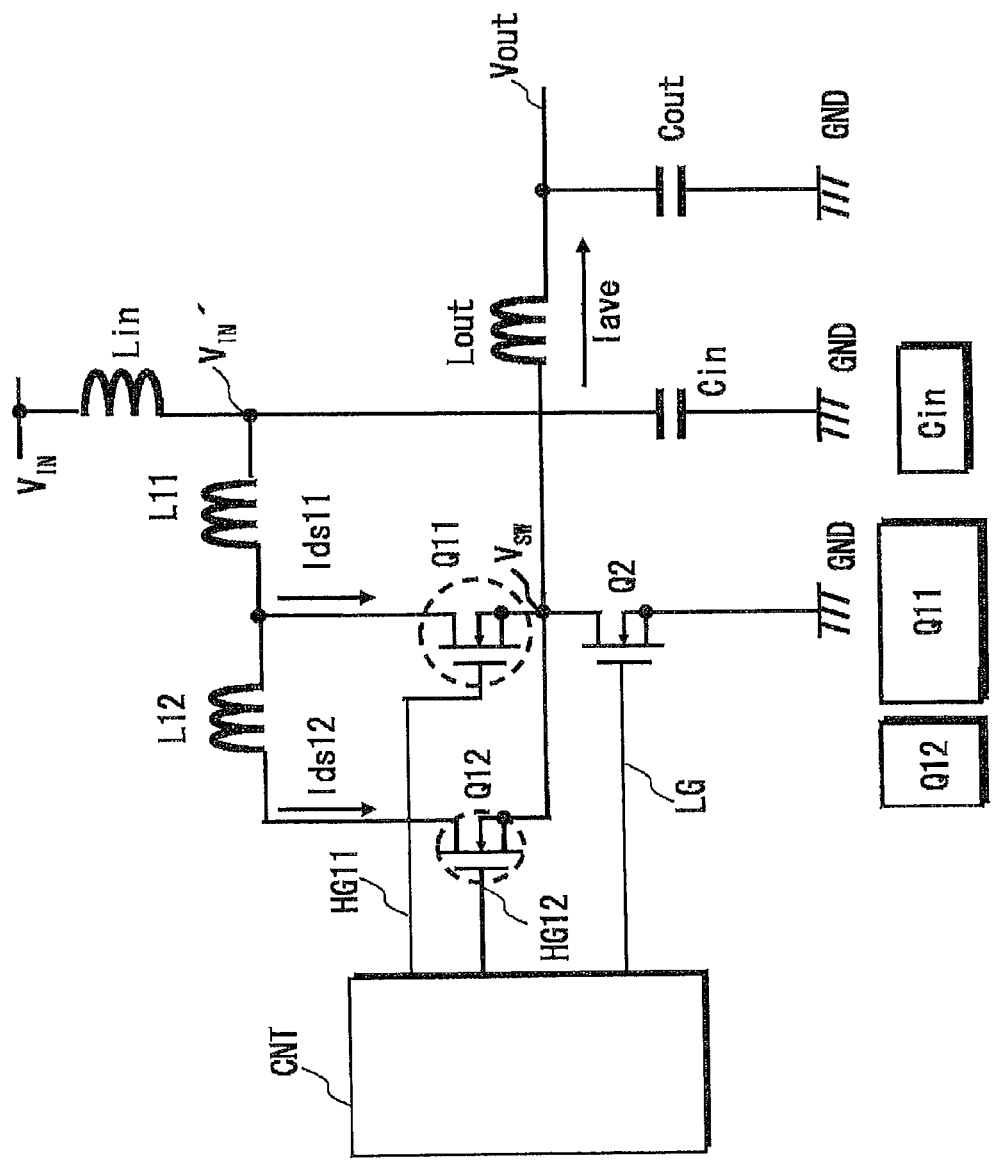
FIG. 6 is a view showing the configuration of a DC-DC converter of a switching regulator system examined by the present inventors prior to the present invention.
Figure 7:
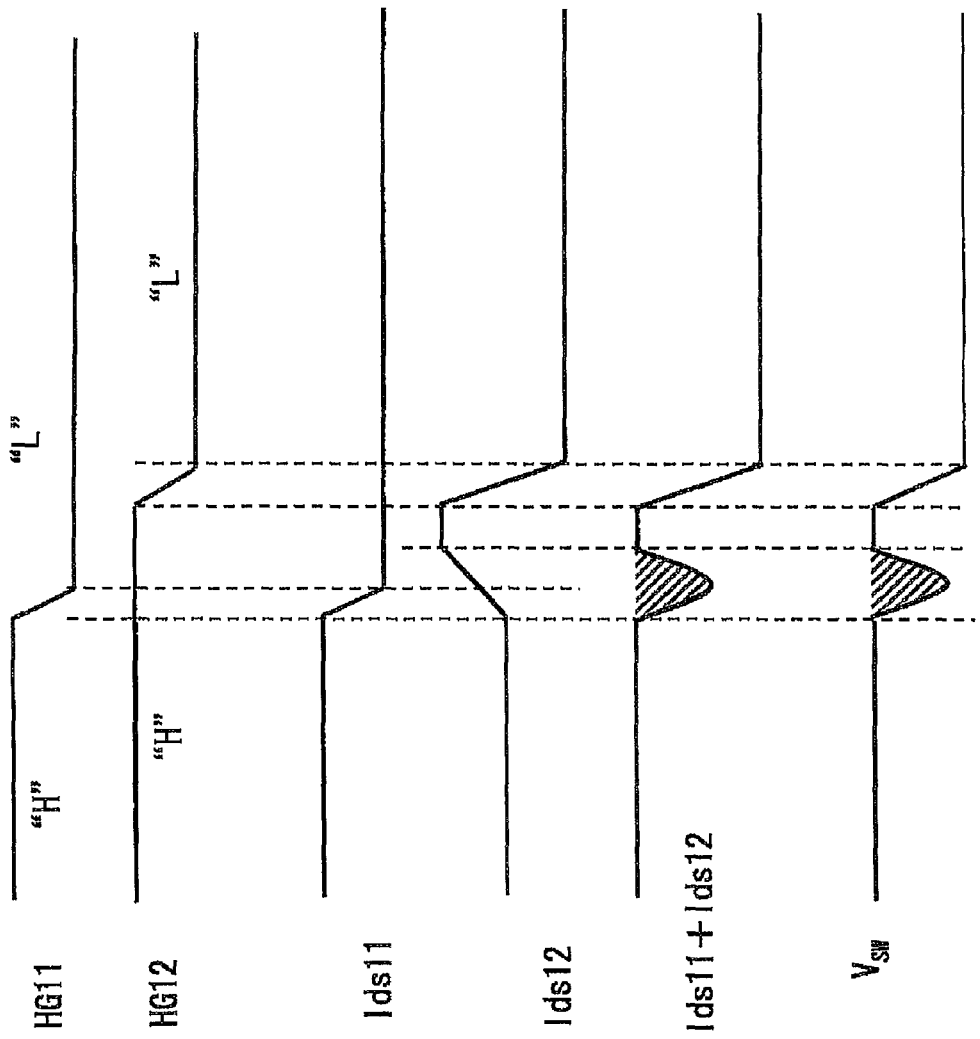
FIG. 7 is an operation waveform diagram showing a system, in which the transistor Q12 set to a small element size is controlled in an off-state by delaying the transistor Q12 relative to the transistor Q11 set to a large element size, in the DC-DC converter of a switching regulator system, shown in FIG. 6, examined by the present inventors prior to the present invention.
Figure 8:
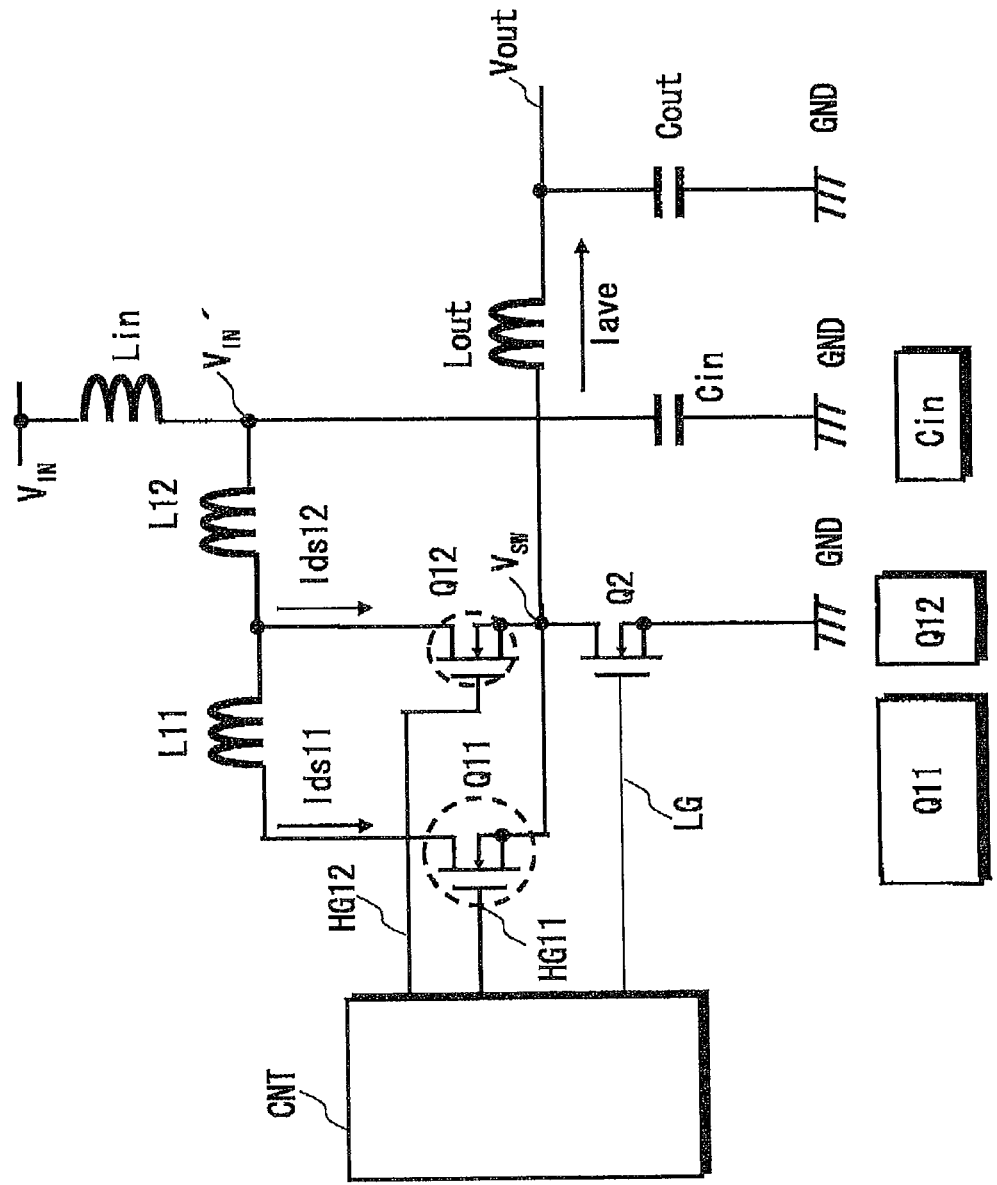
FIG. 8 is a view showing the configuration of a DC-DC converter of a switching regulator system examined by the present inventors prior to the present invention.
Figure 9:
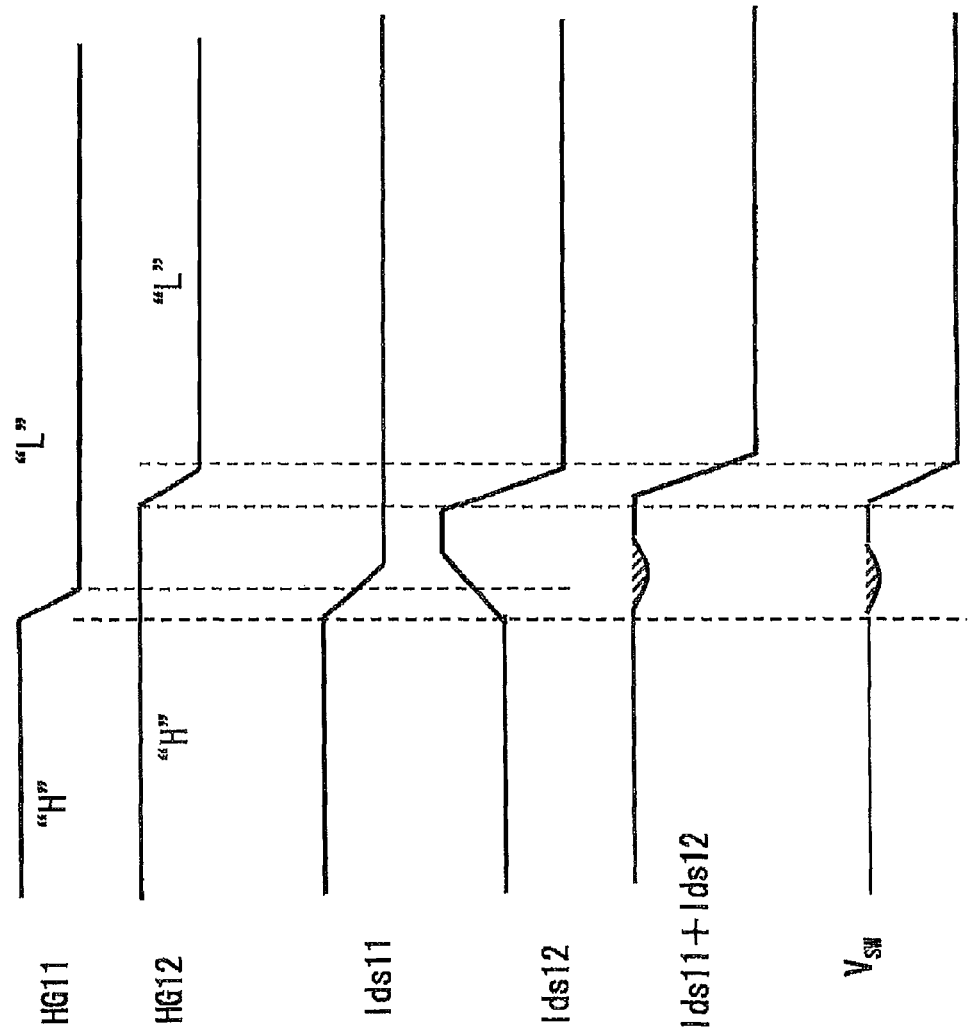
FIG. 9 is an operation waveform diagram showing a system in which the transistor Q12 set to a small element size is controlled in an off-state by delaying the transistor Q12 relative to the transistor Q11 set to a large element size, in the DC-DC converter of a switching regulator system, shown in FIG. 8, examined by the present inventors prior to the present invention.
Figure 10:
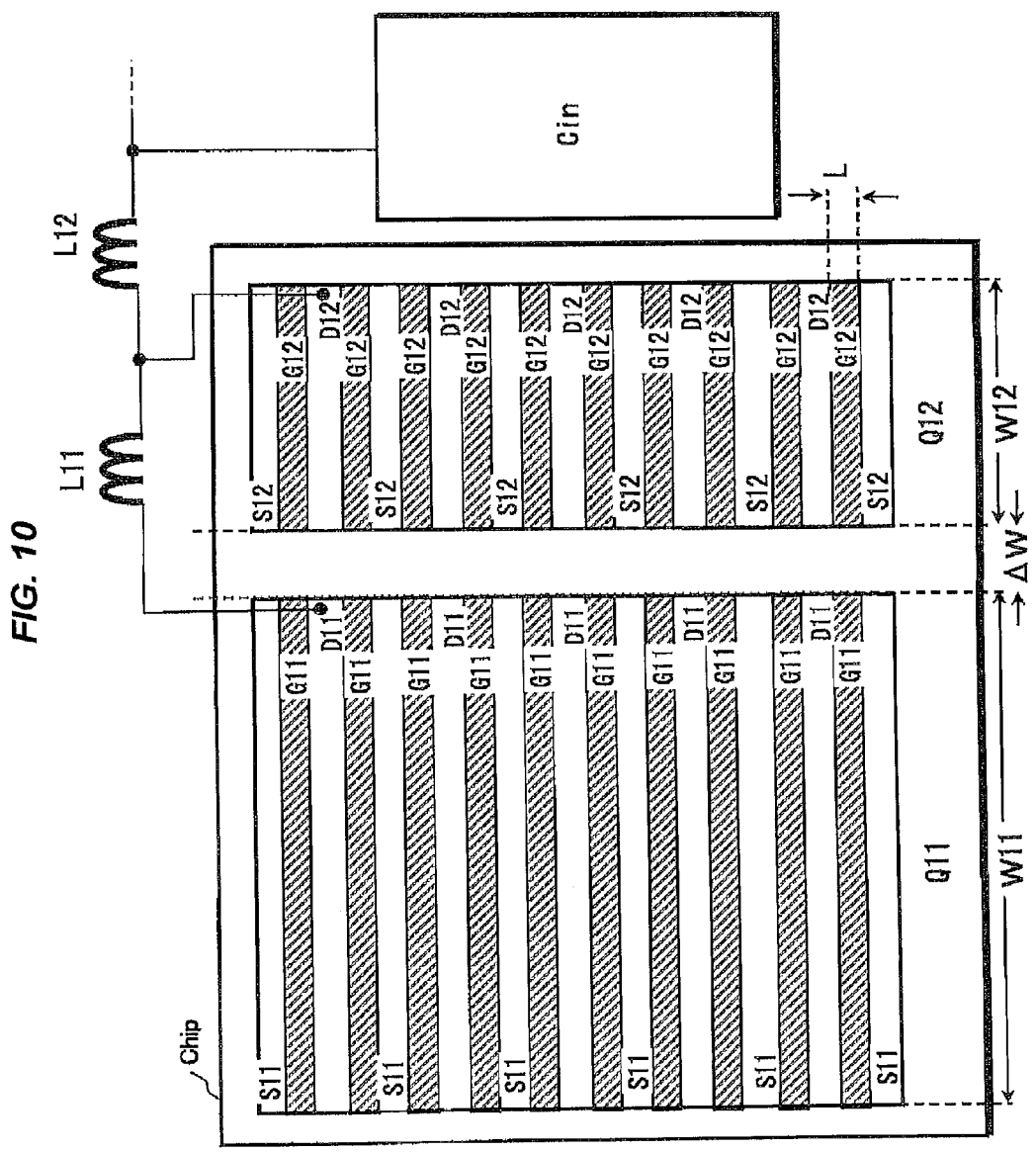
FIG. 10 is a view showing a configuration in which the transistor Q11 of a large element size and the transistor Q12 of a small element size are formed in the same semiconductor chip Chip, in the DC-DC converter of a switching regulator system, shown in FIG. 8 and FIG. 9, examined by the present inventors prior to the present invention.

FIG. 5 is an operation waveform diagram when the controller CNT drives the N-channel MOS transistors Q11 and Q12 of the high-side switch elements and the N-channel MOS transistor Q2 of the low-side switch element, in the DC-DC converter of a switching regulator system according to any of the first embodiment, the second embodiment, and the third embodiment shown in FIG. 1, FIG. 3, and FIG. 4.

As shown in FIG. 5, first, in order to change the transistor Q12 set to have a high switching speed and a small element size from an off-state to an on-state, the controller CNT changes the high-side driving signal HG12 from a low level "L" to a high level "H". As a result, in response to a change from a low level "L" to a high level "H" of the high-side driving signal HG12, a current waveform of the drain current Ids12 of the transistor Q12 of a small element size and a current waveform of the total drain current Ids11+Ids12 flowing through the smoothing inductor Lout start to increase, and thus the voltage waveform of the switching voltage $V_{SW}$ at one end of the smoothing inductor Lout starts to increase.

Subsequently, in order to change the transistor Q11 set to have a low on-resistance and a large element size from an off-state to an on-state, the controller CNT changes the high-side driving signal HG11 from a low level "L" to a high level "H". As a result, in response to a change from a low level "L" to a high level "H" of the high-side driving signal HG11, a current waveform of the drain current Ids11 of the transistor Q11 of a large element size starts to increase, and furthermore, a current waveform of the total drain current Ids11+Ids12 flowing through the smoothing inductor Lout and a voltage waveform of the switching voltage $V_{SW}$ at one end of the smoothing inductor Lout start to increase again.

Subsequently, a timing when the low-side driving signal HG12 for driving the transistor Q12 set to a small element size changes from a high level "H" to a low level "L" is set to be delayed from a timing when the high-side driving signal HG11 for driving the transistor Q11 set to a large element size changes from a high level "H" to a low level "L". As a result, even when the transistor Q11 of a large element size changes from an on-state to an off-state, the transistor Q12 of a small element size is in an on-state at the timing of this change, and thus the drain-to-source voltage of the transistor Q11 of a large element size is maintained at zero volt and thus a reduction of switching loss is possible by the operational principle of zero-volt switching (ZVS).

At the timing when the high-side driving signal HG11 changes from a high level "H" to a low level "L", the drain current Ids11 of the transistor Q11 of a large element size starts to decrease. In contrast, the current value of the total drain current Ids11+Ids12 flowing through the smoothing inductor Lout attempts to be maintained at a constant value, and thus the drain current Ids12 of the transistor Q12 of a small element size starts to increase in an inverse relation to a decrease in the drain current Ids11.

In particular, in any of the first embodiment, the second embodiment, and the third embodiment shown in FIG. 1, FIG. 3, and FIG. 4, the transistor Q11 of a large element size and the transistor Q12 of a small element size have only one parasitic inductor L12, and the value of the parasitic inductor L11 between the transistor Q11 and the transistor Q12 becomes a substantially negligible value. As a result, a rate of decrease of the drain current Ids11 of the transistor Q11 of a large element size and a rate of increase of the drain current Ids12 of the transistor Q12 of a small element size become substantially equal. Accordingly, as shown in FIG. 5, the current value of the total drain current Ids11+Ids12 flowing through the smoothing inductor Lout becomes slightly lower than a certain value as illustrated by hatching during a relatively short time period. Accordingly, the voltage value of the switching voltage $V_{SW}$ at one end of the smoothing inductor Lout also becomes slightly lower than the input voltage $V_{IN}$ of a constant voltage value as illustrated by hatching during a relatively short time period, as shown in FIG. 5. As a result, a significant deviation of the drain-to-source voltage of the transistor Q11 of a large element size from zero volt is alleviated and thus a reduction of the switching loss caused by a deviation from the operational principle of zero-volt switching (ZVS) becomes possible.

As described above, although the invention made by the present inventors has been described specifically based on the various embodiments, it is apparent that the present invention is not limited thereto and various modifications can be made without departing from the purport of the invention.

For example, the transistors Q11 and Q12 as the high-side switch elements and the transistor Q2 as the low-side switch element are not limited only to an N-channel MOS transistor. That is, the transistors Q11 and Q12 as the high-side switch elements and the transistor Q2 as the low-side switch element can be also constituted by an NPN-type bipolar transistor or can be constituted by an IGBT (insulated gate bipolar transistor).

What is claimed is:

1. A semiconductor integrated circuit comprising a high-side switch element, a low-side switch element, and a controller, wherein an input voltage can be supplied to one end of the high-side switch element via a decoupling inductor, other end of the high-side switch element and one end of the low-side switch element are coupled to a switching node, and other end of the low-side switch element can be coupled to an earth potential, wherein the controller can drive the high-side switch element in an on-state and an off-state, wherein the switching node can be coupled to a low pass filter including a smoothing inductor and a smoothing capacitor, wherein a decoupling capacitor can be coupled between the one end of the high-side switch element and the earth potential, wherein the high-side switch element includes a first transistor and a second transistor whose current paths are coupled in parallel between the one end of the high-side switch element and the other end of the high-side switch element, wherein in changing a state between the one end of the high-side switch element and the other end of the high-side switch element from an on-state to an off-state, the controller controls the second transistor from the on-state to the off-state by delaying the second transistor relative to the first transistor, wherein each transistor of the first transistor and the second transistor is formed to be divided into a plurality of parts, inside a semiconductor chip, and wherein a plurality of partial first transistors formed by dividing the first transistor and a plurality of partial second transistors formed by dividing the second transistor are alternately arranged in an arrangement direction of the first transistor and the second transistor, inside the semiconductor chip.

2. The semiconductor integrated circuit according to claim 1, wherein the low-side switch element includes a third transistor whose current path is coupled between the switching node and the earth potential.

3. The semiconductor integrated circuit according to claim 2, wherein the controller generates a first high-side driving signal for driving a control input terminal of the first transistor, a second high-side driving signal for driving a control input terminal of the second transistor, and a low-side driving signal for driving a control input terminal of the third transistor, and wherein the first high-side driving signal and the second high-side driving signal are substantially in-phase, whereas the first high-side driving signal as well as the second high-side driving signal, and the low-side driving signal are substantially anti-phase.

4. The semiconductor integrated circuit according to claim 3, wherein an output voltage of a DC-DC converter generated from the low pass filter is set by an on period during which the high-side switch element is in the on-state, an off period during which the high-side switch element is in the off-state, and the input voltage.

5. The semiconductor integrated circuit according to claim 4, wherein the first transistor, the second transistor, and the third transistor are N-channel MOS transistors, respectively.

6. The semiconductor integrated circuit according to claim 5, wherein the first transistor and the second transistor as the high-side switch elements are formed in a first semiconductor chip, wherein the third transistor as the low-side switch element is formed in a second semiconductor chip, wherein the controller is formed in a third semiconductor chip, and wherein the first semiconductor chip, the second semiconductor chip, and the third semiconductor chip are sealed into one package.

7. The semiconductor integrated circuit according to claim 6, wherein the first transistor and the second transistor as the high-side switch elements are formed by a trench-gate-type N-channel vertical MOS transistor structure, and wherein a plurality of trench gates of the first transistor and a plurality of trench gates of the second transistor are alternately arranged in the arrangement direction of the first transistor and the second transistor, inside the first semiconductor chip.

8. The semiconductor integrated circuit according to claim 7, wherein the third transistor as the low-side switch element is formed by the trench-gate-type N-channel vertical MOS transistor structure.

9. The semiconductor integrated circuit according to claim 8, wherein the one package, the decoupling inductor, the decoupling capacitor, the smoothing inductor, and the smoothing capacitor comprise a DC-DC converter of a switching regulator system.

10. The semiconductor integrated circuit according to claim 5, wherein the first transistor and the second transistor as the high-side switch elements, the third transistor as the low-side switch element, and the controller are integrated and formed in a single semiconductor chip, and wherein the single semiconductor chip is sealed into one package.

11. The semiconductor integrated circuit according to claim 10, wherein the first transistor and the second transistor as the high-side switch elements are formed by a planer-type N-channel lateral MOS transistor structure, and wherein a plurality of gates of the first transistor and a plurality of gates of the second transistor are alternately arranged in the arrangement direction of the first transistor and the second transistor, inside the single semiconductor chip.

12. The semiconductor integrated circuit according to claim 11, wherein the third transistor as the low-side switch element is formed by the planer-type N-channel lateral MOS transistor structure inside the single semiconductor chip.

13. The semiconductor integrated circuit according to claim 12, wherein the single semiconductor chip, the decoupling inductor, the decoupling capacitor, the smoothing inductor, and the smoothing capacitor comprise a DC-DC converter of a switching regulator system.

14. A method for operating a semiconductor integrated circuit comprising a high-side switch element, a low-side switch element, and a controller,
- wherein an input voltage can be supplied to one end of the high-side switch element via a decoupling inductor, other end of the high-side switch element and one end of the low-side switch element are coupled to a switching node, and other end of the low-side switch element can be coupled to an earth potential,
- wherein the controller can drive the high-side switch element in an on-state and an off-state,
- wherein the switching node can be coupled to a low pass filter including a smoothing inductor and a smoothing capacitor,
- wherein a decoupling capacitor can be coupled between the one end of the high-side switch element and the earth potential,
- wherein the high-side switch element includes a first transistor and a second transistor whose current paths are coupled in parallel between the one end of the high-side switch element and the other end of the high-side switch element,
- wherein in changing the state between the one end of the high-side switch element and the other end of the high-side switch element from an on-state to an off-state, the controller controls the second transistor from the on-state to the off-state by delaying the second transistor relative to the first transistor,
- wherein each transistor of the first transistor and the second transistor is formed to be divided into a plurality of parts, inside a semiconductor chip, and
- wherein a plurality of partial first transistors formed by dividing the first transistor and a plurality of partial second transistors formed by dividing the second transistor are alternately arranged in an arrangement direction of the first transistor and the second transistor, inside the semiconductor chip.

15. The method according to claim 14,
- wherein the low-side switch element includes a third transistor whose current path is coupled between the switching node and the earth potential.

16. The method according to claim 15,
- wherein the controller generates a first high-side driving signal for driving a control input terminal of the first transistor, a second high-side driving signal for driving a control input terminal of the second transistor, and a low-side driving signal for driving a control input terminal of the third transistor, and
- wherein the first high-side driving signal and the second high-side driving signal are substantially in-phase, whereas the first high-side driving signal as well as the second high-side driving signal and the low-side driving signal are substantially anti-phase.

17. The method according to claim 16,
- wherein an output voltage of a DC-DC converter generated from the low pass filter is set by an on period during which the high-side switch element is in the on-state, an off period during which the high-side switch element is in the off-state, and the input voltage.

18. The method according to claim 17,
- wherein the first transistor, the second transistor, and the third transistor are N-channel MOS transistors, respectively.

19. The method according to claim 15,
- wherein the first transistor and the second transistor as the high-side switch elements are formed in a first semiconductor chip,
- wherein the third transistor as the low-side switch element is formed in a second semiconductor chip, wherein
- the controller is formed in a third semiconductor chip, and
- wherein the first semiconductor chip, the second semiconductor chip, and the third semiconductor chip are sealed into one package.

20. The method according to claim 19,
- wherein the first transistor and the second transistor as the high-side switch elements are formed by a trench-gate-type N-channel vertical MOS transistor structure, and
- wherein a plurality of trench gates of the first transistor and a plurality of trench gates of the second transistor are alternately arranged in the arrangement direction of the first transistor and the second transistor, inside the first semiconductor chip.

* * * * *